(12) United States Patent
Kuwabara et al.

(10) Patent No.: US 11,011,822 B2
(45) Date of Patent: May 18, 2021

(54) ANTENNA APPARATUS, CIRCUIT BOARD, AND ARRANGEMENT METHOD

(71) Applicant: NEC Corporation, Tokyo (JP)

(72) Inventors: Toshihide Kuwabara, Tokyo (JP); Tomoya Kaneko, Tokyo (JP)

(73) Assignee: NEC CORPORATION, Tokyo (JP)

( * ) Notice: Subject to any disclaimer, the term of this patent is extended or adjusted under 35 U.S.C. 154(b) by 68 days.

(21) Appl. No.: 16/339,507

(22) PCT Filed: Oct. 4, 2017

(86) PCT No.: PCT/JP2017/036108
§ 371 (c)(1),
(2) Date: Apr. 4, 2019

(87) PCT Pub. No.: WO2018/066593
PCT Pub. Date: Apr. 12, 2018

(65) Prior Publication Data
US 2020/0052364 A1  Feb. 13, 2020

(30) Foreign Application Priority Data
Oct. 7, 2016 (JP) .............................. JP2016-199179

(51) Int. Cl.
*H01Q 1/12* (2006.01)
*H01Q 1/38* (2006.01)
(Continued)

(52) U.S. Cl.
CPC ................. *H01Q 1/12* (2013.01); *H01Q 1/38* (2013.01); *H01Q 21/06* (2013.01); *H05K 1/02* (2013.01);
(Continued)

(58) Field of Classification Search
CPC ............ H01Q 1/12; H01Q 1/38; H01Q 15/20; H01Q 21/06; H05K 1/0243; H05K 1/0203; H05K 1/14; H05K 1/02
(Continued)

(56) References Cited

U.S. PATENT DOCUMENTS 5,227,808 A * 7/1993 Davis ................... H01Q 13/085
343/767
6,043,785 A * 3/2000 Marino .................. H01Q 1/246
343/700 MS
(Continued)

FOREIGN PATENT DOCUMENTS

JP   2004-039857 A   2/2004
JP   2004-120325 A   4/2004

OTHER PUBLICATIONS

Communication dated Jan. 7, 2020 from the Japanese Patent Office in application No. 2018-543935.
(Continued)

*Primary Examiner* — Hai V Tran

(57) ABSTRACT

An antenna apparatus includes a plurality of circuit boards, an antenna element, and an electronic component. A plurality of the antenna elements are arranged along the surfaces of the plurality of circuit boards. The electronic component is arranged along the surfaces of the circuit boards, configured to be larger in size in the thickness direction of the circuit boards than a gap between the antenna elements, and connected to the arranged antenna elements via a high-frequency transmission circuit. The plurality of circuit boards are arranged with component mounting surfaces arranged oppositely to each other and, for each pair, the positions corresponding to the electronic component are misaligned in the surface direction of the circuit boards.

12 Claims, 7 Drawing Sheets

(51) Int. Cl.
*H01Q 21/06* (2006.01)
*H05K 1/14* (2006.01)
*H05K 1/02* (2006.01)

(52) U.S. Cl.
CPC ......... *H05K 1/0203* (2013.01); *H05K 1/0243* (2013.01); *H05K 1/14* (2013.01); *H05K 2201/10098* (2013.01)

(58) Field of Classification Search
USPC .......................................................... 343/878
See application file for complete search history.

(56) References Cited

U.S. PATENT DOCUMENTS

| | | | |
|---|---|---|---|
| 8,648,759 B2* | 2/2014 | Wang | H01Q 21/20 343/770 |
| 9,325,075 B1 | 4/2016 | Lam | |
| 2003/0189515 A1* | 10/2003 | Jacomb-Hood | H01Q 21/064 342/373 |
| 2006/0270279 A1* | 11/2006 | Heisen | H01R 12/62 439/637 |
| 2010/0066631 A1* | 3/2010 | Puzella | H01Q 21/0087 343/853 |
| 2012/0056796 A1* | 3/2012 | Kato | H05K 1/0233 343/788 |
| 2013/0169505 A1* | 7/2013 | Shmuel | H01Q 1/1235 343/848 |
| 2015/0015453 A1* | 1/2015 | Puzella | H05K 1/0206 343/853 |

OTHER PUBLICATIONS

International Search Report of PCT/JP2017/036108 dated Dec. 19, 2017.

* cited by examiner

ANTENNA APPARATUS, CIRCUIT BOARD, AND ARRANGEMENT METHOD

CROSS REFERENCE TO RELATED APPLICATIONS

This application is a National Stage of International Application No. PCT/JP2017/036108 filed Oct. 4, 2017, claiming priority based on Japanese Patent Application No. 2016-199179 filed Oct. 7, 2016, the contents of which are incorporated herein by reference.

TECHNICAL FIELD

The present invention relates to an antenna apparatus, a circuit board, and an arrangement method.

BACKGROUND ART

An antenna apparatus including an array antenna is sometimes used in base stations for mobile phones. In such an antenna apparatus, miniaturization is desired.

As a related technique, Patent Document 1 discloses a technique for miniaturizing an antenna apparatus.

Prior Art Documents

Patent Documents

[Patent Document 1] Japanese Unexamined Patent Application No. 2004-039857

SUMMARY OF THE INVENTION

Problems to be Solved by the Invention

There is a tendency for the operating frequencies in mobile communications to become higher. Since the geometric interval between antenna elements in array antennas is generally required to be approximately a half wavelength of the operating frequency band, as the operating frequency becomes higher, miniaturization is realized using, for example, the technique disclosed in Patent Document 1.

However, when the gap between the antenna elements becomes extremely narrow, it is difficult to secure a space for housing electronic components belonging to the antenna elements. Furthermore, in the case of high-frequency, high-power electronic components used in base stations for mobile communications, there is the problem that mounting of electronic components and means of heat dissipation or heat transport in the narrow space between antenna elements is particularly difficult.

The present invention has as its object to provide an antenna apparatus, a circuit board, a heat transport means, and an arrangement method capable of solving the aforementioned problems.

Means for Solving the Problems

In order to achieve the aforementioned object, the antenna apparatus of the present invention is provided with a plurality of circuit boards arranged in parallel with component mounting surfaces arranged oppositely to each other, a plurality of antenna elements that are arranged along mutually adjacent sides of the plurality of circuit boards, being arranged side by side in an orthogonal direction that is orthogonal to the component mounting surfaces of the plurality of circuit boards; and an electronic component arranged along the component installation surfaces of the circuit boards and connected to the antenna elements via a high-frequency transmission circuit, in which the plurality of circuit boards are arranged so that a gap therebetween in the orthogonal direction is greater than a gap between the plurality of antenna elements arranged side by side in the orthogonal direction, and the electronic components arranged on different circuit boards at the opposing component mounting surfaces are arranged misaligned in the mounting surface direction of the circuit boards.

An antenna apparatus of the present invention is provided with a plurality of circuit boards arranged in parallel in an orthogonal direction that is orthogonal to a component mounting surface; a plurality of antenna elements provided in a first space between the plurality of circuit boards; an electronic component that is provided in the first space and connected via a high-frequency transmission circuit to the antenna elements; and a heat flow path provided in a second space adjacent to the first space.

A circuit board of the present invention to which is mounted an electronic component that is connected by a high-frequency transmission circuit to antenna elements arranged in a plurality, with a spatial dimension in which the electronic component is mounted in the thickness direction of the circuit board configured to be larger than a gap between the antenna elements arranged in a plurality, the circuit board being arranged with mounting surfaces arranged oppositely to each other and, for each pair, positions corresponding to the electronic component misaligned in the surface direction of the circuit board.

An arrangement method for circuit boards of the present invention arranges circuit boards on each of which is mounted an electronic component that supplies power to antenna elements arranged in a plurality, with a spatial dimension in which the electronic components are mounted in the thickness direction of the circuit boards configured to be larger than a gap between the antenna elements arranged in a plurality, mounting surfaces arranged oppositely to each other and, for each pair, positions corresponding to the electronic components misaligned in the surface direction of the circuit boards.

Advantageous Effects of the Invention

According to the present invention, in an antenna apparatus required to be capable of outputting high-power radio waves with a high frequency and in which electronic components with a large size are used, ideal antenna element spacing dependent on wavelength, electronic component mounting, and a heat transport means are simultaneously realized.

EMBODIMENTS FOR CARRYING OUT THE INVENTION

Embodiment

Hereinbelow, an embodiment will be described in detail with reference to the drawings.

An antenna apparatus 1 according to the embodiment of the present invention will be described.

Figure 1:
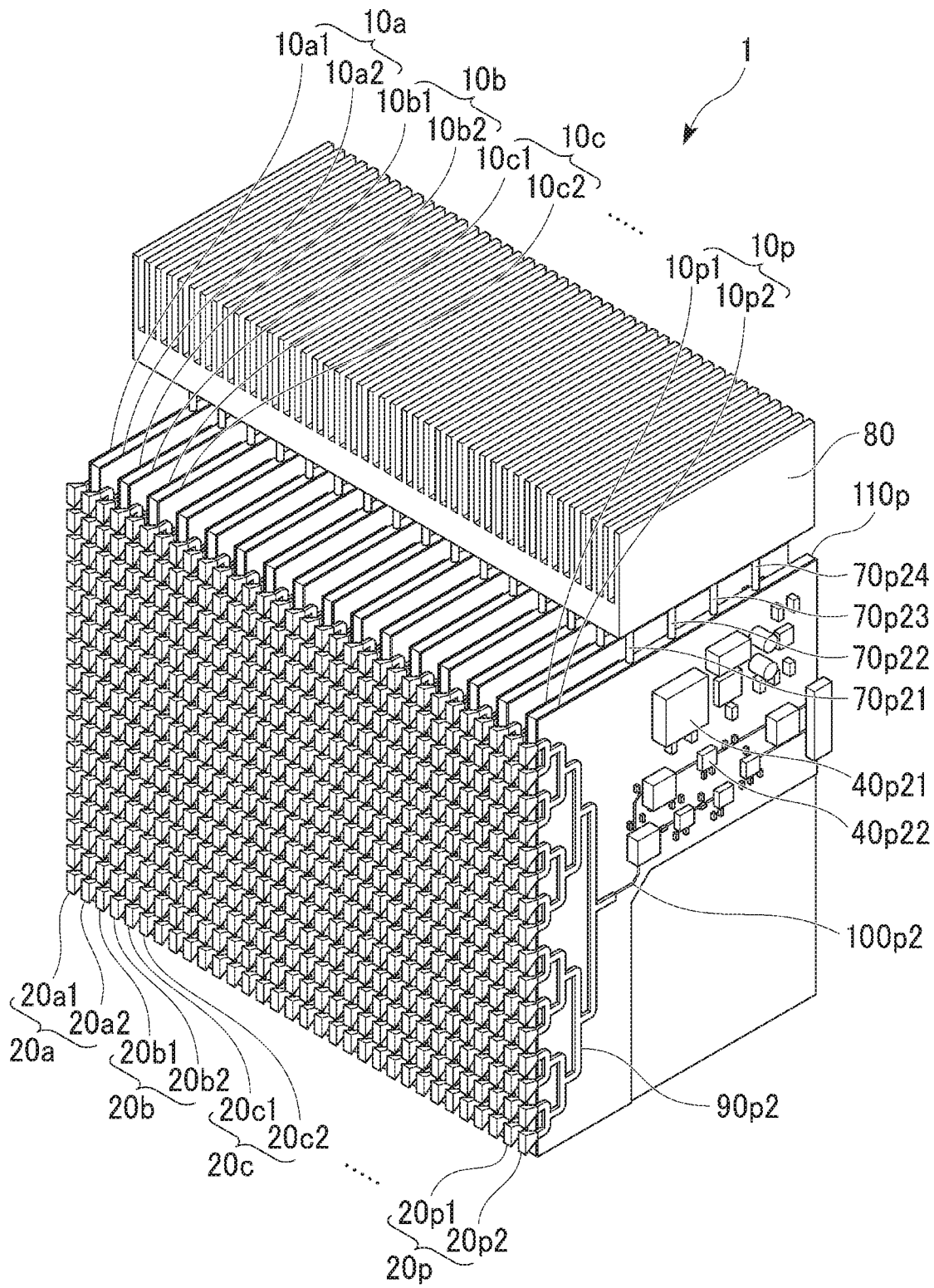
FIG. 1 is a perspective view showing an antenna apparatus according to an embodiment of the present invention.
Figure 2:
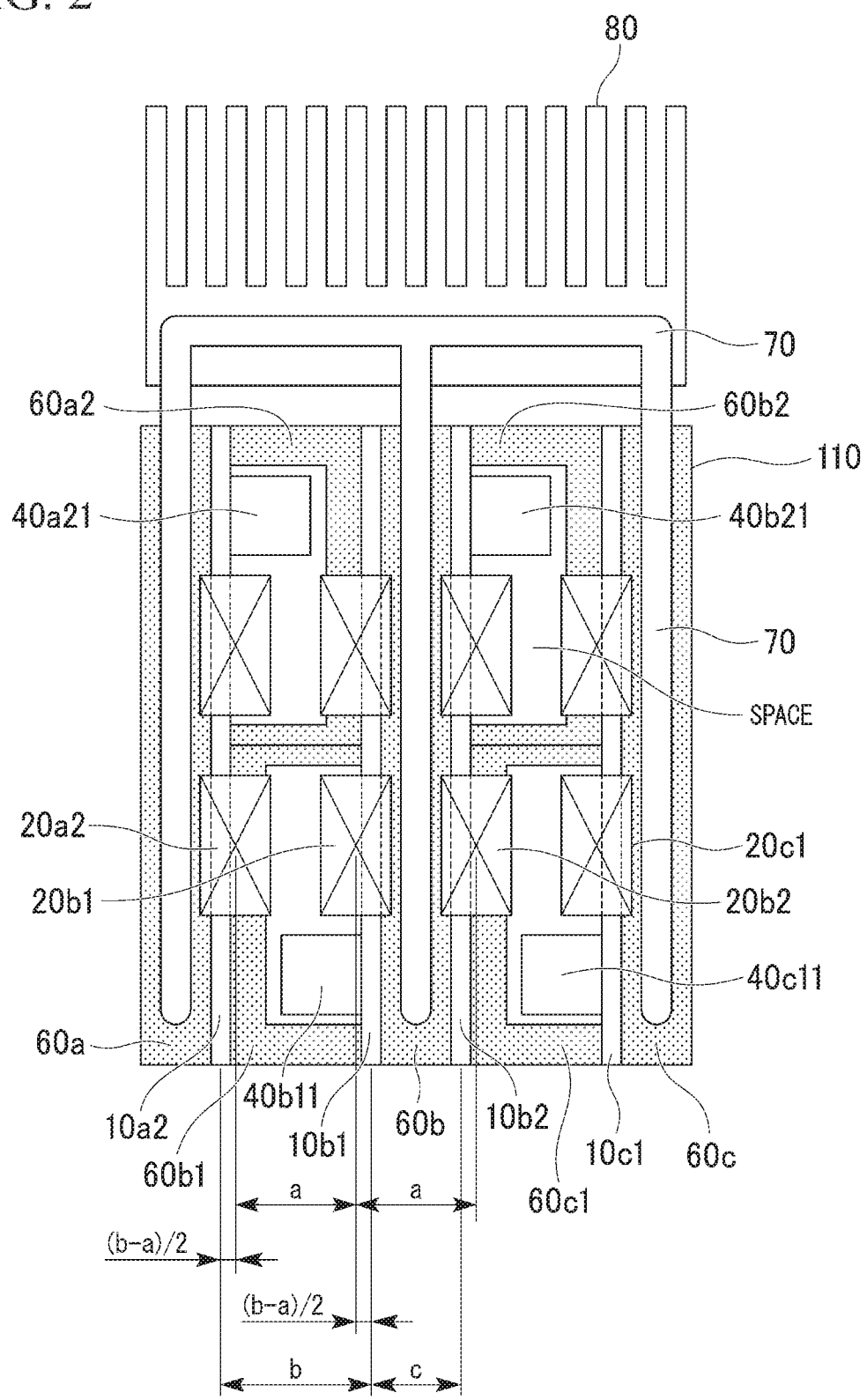
FIG. 2 is a cross-sectional view showing a part of the antenna apparatus shown in FIG. 1.

As shown in FIG. 1, the antenna apparatus 1 according to the embodiment of the present invention includes circuit boards $10a1, 10a2, 10b1, \ldots, 10p2$, antenna elements $20a1, 20a2, 20b1, \ldots, 20p2$, electronic components $40a11, 40a12, 40a21, 40a22, 40b11, \ldots, 40p21, 40p22$, a heat pipe 70, and a radiator 80. As shown in FIG. 2, the antenna apparatus 1 includes conductive caps (60a1) 60a2, 60b1, 60b2, 60c1, . . . , 60p1. In order to make the structure of the antenna apparatus 1 easy to understand, the conductive caps are not shown in FIG. 1.

Hereinbelow, the circuit boards $10a1, 10a2, 10b1, \ldots, 10p2$ are collectively referred to as circuit boards 10. Further, the antenna elements $20a1, 20a2, 20b1, \ldots, 20p2$ are collectively referred to as antenna elements 20. Also, the electronic components $40a11, 40a12, 40a21, 40a22, 40b11, \ldots, 40p22, 40p22$ are collectively referred to as an electronic component 40. The conductive caps $60a1, 60a2, 60b1, \ldots, 60p2$ are collectively referred to as a conductive cap 60.

The circuit board $10a1$ supplies power to the antenna element $20a1$. In the circuit board $10a1$, the electronic components $40a11$ and $40a12$ are mounted on a component mounting surface. The electronic components $40a11$ and $40a12$ constitute a circuit that realizes the functions of a filter, a transmission unit, a low-noise amplifier, a power amplifier, an up converter, a down converter, and the like.

Further, the circuit board $10a2$ supplies power to the antenna element $20a2$. In the circuit board $10a2$, the electronic components $40a21$ and $40a22$ are mounted on a component mounting surface. The electronic components $40a21$ and $40a22$ constitute a circuit that realizes the functions of a filter, a transmission unit, a low-noise amplifier, a power amplifier, an up converter, a down converter, and the like.

The circuit board $10a1$ forms a pair with the circuit board $10a2$. Also, the circuit boards $10b1$ and $10b2$, $10c1$ and $10c2$, . . . , $10p1$ and $10p2$ form pairs similarly to the circuit boards $10a1$ and $10a2$. Hereinbelow, the pair of circuit board $10a1$ and circuit board $10a2$ are referred to as circuit board $10a$. The pair of circuit board $10b1$ and circuit board $10b2$ are referred to as circuit board $10b$, . . . , and the pair of circuit board $10p1$ and circuit board $10p2$ are referred to as circuit board $10p$. The positions of the circuit board $10a$ to the circuit board $10p$ are each in turn shifted in a direction orthogonal to the component mounting surface (orthogonal direction), whereby the component mounting surfaces are arranged oppositely to each other. A gap in the orthogonal direction between the circuit board $10a$ and the circuit board $10b$ is, for example, a gap b shown in FIG. 2 corresponding to a mounted electronic component having the greatest height (length in the lateral direction in FIG. 2) among the electronic components $40a11$ to $40p22$ (for example, b=a+ Δ). The gap between the circuit boards $10a1$ and $10a2$, $10b1$ and $10b2$, . . . , $10p1$ and $10p2$ is c (for example, c=a−Δ). It should be noted that Δ indicates zero or a positive length.

It is desirable that one circuit board $10a$ and another circuit board $10b$ that are opposite to each other be arranged such that the positions of electronic components protruding from the surfaces of the circuit boards are mutually misaligned, and in particular the positions of the electronic components with the greatest height are arranged so as not to overlap each other in plan view.

Each of the circuit boards $10b1, 10c1, \ldots, 10p1$ has the same configuration as the circuit board $10a1$.

Each of the circuit boards $10b2, 10b2, \ldots, 10p2$ has the same configuration as the circuit board $10a2$.

As shown in FIG. 1, in each of the circuit boards $10a, 10b, \ldots, 10p$, the positions are in turn misaligned in a direction orthogonal to the component mounting surface (orthogonal direction).

The antenna element $20a1$ is formed with, for example, a waveguide or a conductor pattern. The antenna element $20a1$ is arranged along one side of the circuit board $10a1$ that is positioned at the front (front face) of the antenna apparatus 1. The antenna element $20a1$ is connected to the electronic component $40a1$ by a high-frequency transmission circuit $90a1$. The example of the antenna element $20a1$ shown in FIG. 1 is an antenna array in which 16 horn antennas obtained by dividing a single path into 16 with a four-stage hierarchical structure are arranged at an interval corresponding to a signal wavelength in the vertical direction along one side of the circuit board $10a1$. The gap corresponding to the wavelength is, assuming a wavelength of λ, for example a constant gap of about 0.5λ to 0.7λ, in which a grating lobe hardly occurs in a phased array antenna.

The antenna element $20a2$ is arranged along one side of the circuit board $10a2$ that is positioned at the front and is connected to the electronic components $40a21, 40a22$ by the high-frequency transmission circuit 90. The side of the circuit board $10a2$ on which the antenna element $20a2$ is provided is adjacent and parallel to the side of the circuit board $10a1$ on which the antenna element $20a1$ is provided. The example of the antenna element $20a2$ shown in FIG. 1 is an antenna array in which 16 horn antennas obtained by dividing a single path into 16 are arranged at an interval corresponding to a signal wavelength in the vertical direction (the direction along the side of the circuit board $10a1$ on which the antennal element $20a2$ is provided).

Each of the antenna elements $20b1, 20c1, \ldots, 20p1$ has the same configuration as the antenna element $20a1$.

Each of the antenna elements $20b2, 20c2, \ldots, 20p2$ has the same configuration as the antenna element $20a2$.

As shown in FIG. 1, each of the antenna elements 20 is in turn arranged at a position shifted in the direction orthogonal to the component mounting surface of the circuit board 10.

FIG. 1, being an image drawing for explaining the embodiment of the present invention, is not drawn to an accurate dimensional ratio, but the gap in the lateral direction between each actual antenna element 20 (the orthogonal direction that is orthogonal to the component mounting surfaces of the circuit boards 10) is the same gap as the gap in which the horn antennas are arranged according to the signal wavelength. The entire antenna element 20 constitutes an array antenna, with a phased array antenna being realized by the circuit board 10, the electronic component 40 mounted on the circuit board 10, the high-frequency transmission circuit 90 (a collective name for the high-frequency transmission circuits 90a1 to 90p2 corresponding respectively to the circuit boards 10a1 to 10p2) and the high-frequency transmission line 100 (a collective name for the high-frequency transmission lines 100a1 to 100p2 corresponding respectively to the circuit boards 10a1 to 10p2), and the like.

Each of the electronic components 40 constitutes a circuit that realizes the functions of a filter, time division communication, an amplifier, an up converter, a down converter, and the like.

The combined height of the heights of the electronic components 40 arranged at opposing positions (projection amounts from the respective circuit boards 10) does not become greater than the gap between the opposing circuit boards 10 forming a pair.

Figure 3:
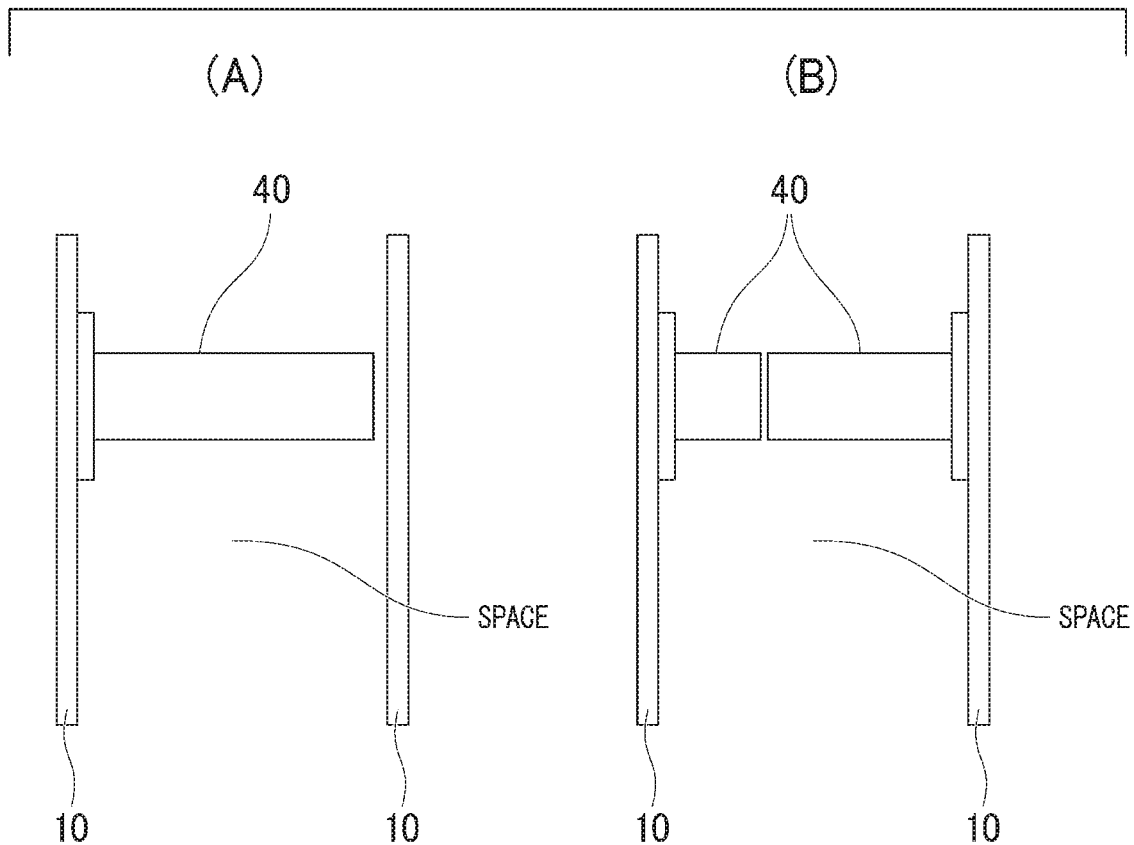
FIG. 3 is a drawing showing an arrangement of electronic components arranged in opposing positions in the antenna apparatus shown in FIG. 2.

For example, as shown in portion (A) of FIG. 3, when the electronic component 40 is mounted on only one circuit board 10 at an opposing position, the height of the electronic component 40 is equal to or less than the gap between the pair of opposing circuit boards 10. Further, for example, as shown in the portion (B) of FIG. 3, when electronic components 40 are mounted on both circuit boards 10 at opposing positions, the total height of the electronic components 40 mounted on the opposing circuit boards 10 is equal to or less than the distance between the pair of opposing circuit boards 10.

The conductive cap 60a1 covers each of the electronic components 40a11 and 40a12. The conductive cap 60a1 is made of a conductive material and blocks electromagnetic waves emitted from the electronic components 40a11 and 40a12 and a high-frequency transmission line 100 in the vicinity thereof.

The conductive cap 60a2 covers each of the electronic components 40a21 and 40a22. The conductive cap 60a2 is made of a conductive material and blocks electromagnetic waves emitted from the electronic components 40a12 and 40a22 and a high frequency transmission line 100a2 in the vicinity thereof.

Each of the conductive caps 60b1 to 60p1 has the same configuration as that of the conductive cap 60a1.

Each of the conductive caps 60b2 to 60p2 has the same configuration as that of the conductive cap 60a2.

A plate 110 (a collective name for plates 110a to 110p corresponding to the circuit boards 10a1 to 10p2) is disposed between corresponding boards of the circuit boards 10a1 and 10a2, 10b1 and 10b2, . . . , 10p1 and 10p2. Each plate 110 is a plate-like component manufactured using a material having high thermal conductivity (for example, copper, aluminum, or the like).

The heat pipe 70 (a collective name for heat pumps 70a11, 70a12, 70a13, 70a14 to 70p21, 70p22, 70p23, and 70p24 corresponding to the respective circuit boards 10a1 to 10p2) is disposed inside each plate 110. The heat pipe 70 transfers the heat generated in each of the circuit boards 10 to the radiator 80 by repeatedly vaporizing and liquefying the heat medium accommodated therein.

The radiator 80 is connected to the heat pipe 70. The radiator 80 discharges the heat transmitted from the heat pipe 70 into the atmosphere.

In this way, there is arranged the circuit board 10 on which is mounted an electronic component 40 that supplies power to antenna elements 20 arranged in a plurality, with a dimension in the thickness direction of the circuit board 10 (the direction orthogonal to the component mounting surface) configured to be larger than a gap in the lateral direction in FIG. 2 between the antenna elements 20 arranged in a plurality, with circuit boards and mounting surfaces forming adjacent pairs arranged oppositely to each other and, for each pair, positions corresponding to the electronic component 40 misaligned in the surface direction of the circuit board 10.

The antenna apparatus 1 according to the embodiment of the present invention has been described above. The antenna apparatus 1 according to the embodiment of the present invention is provided with a plurality of the circuit boards 10, the antenna element 20, and the electronic component 40. A plurality of antenna elements 20 are arranged along the surfaces of the plurality of circuit boards 10.

The electronic component 40 is arranged along the surfaces of the circuit boards 10, with the dimension in the thickness direction of the circuit boards 10 configured to be larger than a gap between the antenna elements 20, and supplies power to the plurality of arranged antenna elements 20. The circuit boards 10 forming pairs are arranged with circuit boards and component mounting surfaces forming adjacent pairs arranged oppositely to each other and, for each pair, positions corresponding to the electronic component 40 are misaligned in pairs in the surface direction of the circuit boards 10.

In this way, it is possible to reduce the size of the antenna apparatus 1 that is required to have a capability of outputting radio waves of high frequency and that uses electronic components of large dimensions.

Further, by providing a heat flow path between the circuit boards 10a1 and 10a2, 10b1 and 10b2, . . . , 10p1 and 10p2, heat can be released from the narrow flow path into the atmosphere.

Figure 4:
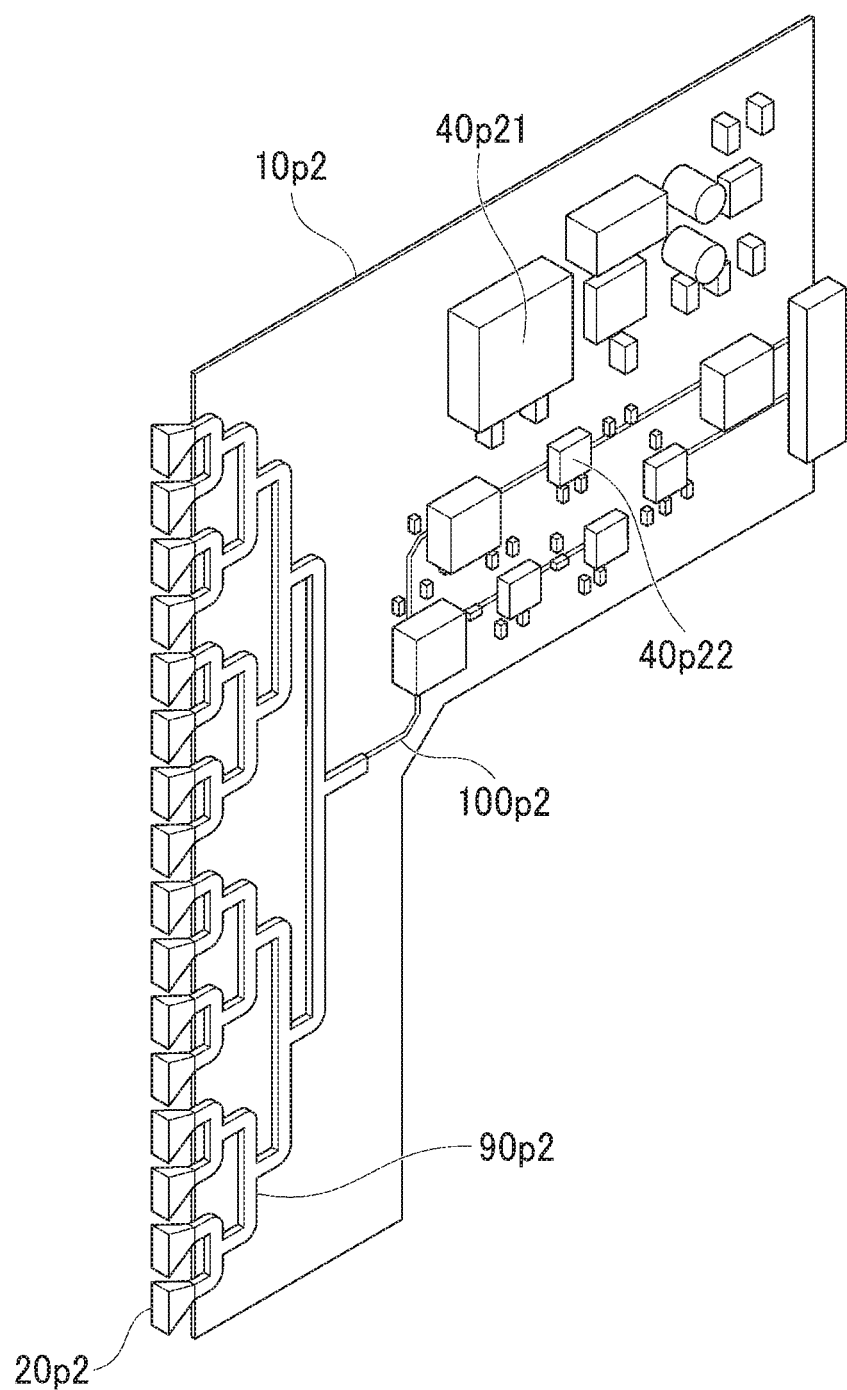
FIG. 4 is a drawing showing one circuit board and an electronic component mounted state in the antenna apparatus shown in FIG. 1.

Next, FIG. 4 shows the circuit board 10p2 as an example of a single circuit board on which components are mounted.

The one circuit board 10p2 shown here on which components are mounted is the circuit board 10p2 in the antenna apparatus 1 shown in FIG. 1.

In the circuit board 10p2, the electronic components 40p21 and 40p22, the high-frequency transmission circuit 90p2, the high-frequency transmission line 100p2, and the like are surface-mounted. The electronic components 40p21 and 40p22 constitute a circuit for realizing the functions of a filter, a transmission unit, a low-noise amplifier, a power amplifier, an up converter, a down converter, or the like. The circuit board 10p2 supplies power to the antenna element 20p2.

Figure 5:
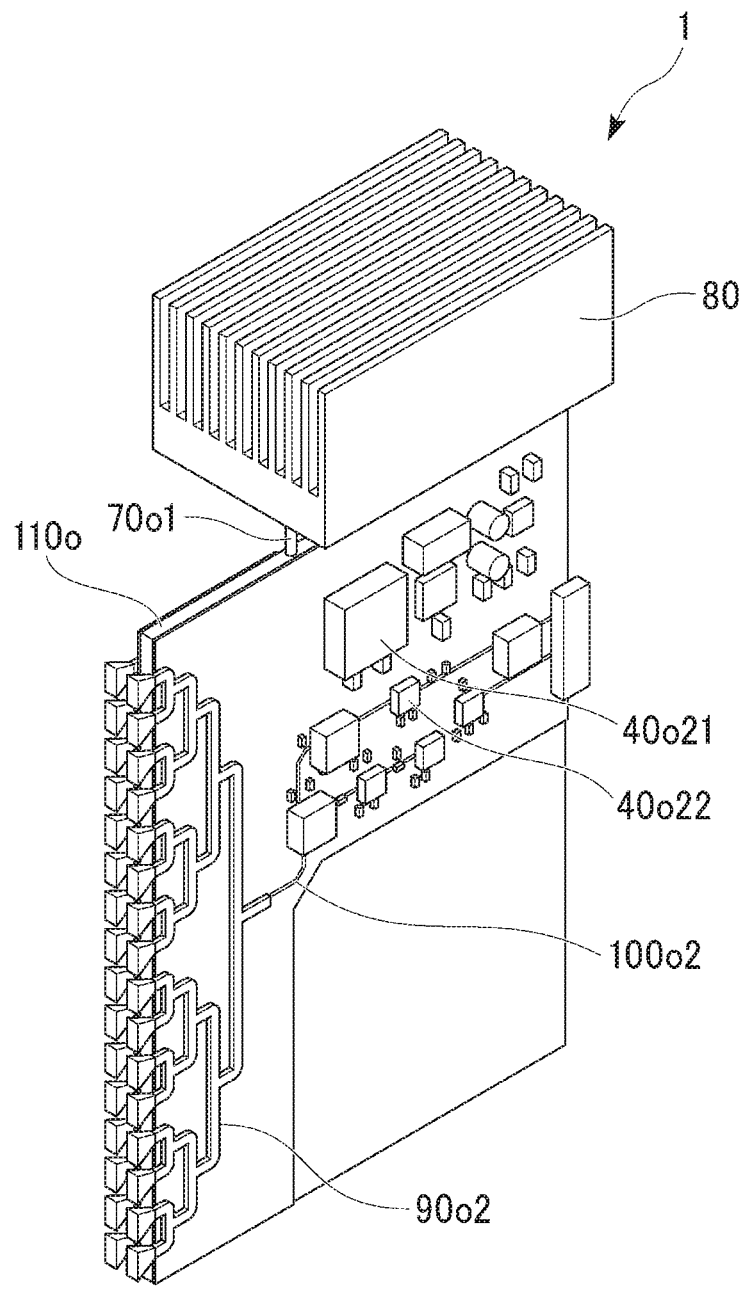
FIG. 5 is a perspective view showing a circuit board of one unit according to an embodiment of the present invention.

Next, an example of two circuit boards sandwiching a plate is shown in FIG. 5.

In the example of the two circuit boards shown here, circuit board o1 and circuit board o2 sandwich a plate 110o.

On the circuit board o1, electronic components 40o11, 40o12, a high-frequency transmission circuit 90o1, a high-frequency transmission line 100o1 and the like are surface-mounted.

On the circuit board o2, electronic components 40o21, 40p22, a high-frequency transmission circuit 90o2, a high-frequency transmission line 100o2 and the like are surface-mounted.

The surface of the circuit board o1 on which the electronic components 40o11, 40o12, the high-frequency transmission circuit 90o1, the high-frequency transmission line 100o1, and the like are not surface mounted and the surface of the circuit board o2 on which the electronic components 40o21, 40p22, the high-frequency transmission circuit 90o2, and the high-frequency transmission line 100o2 are not mounted sandwich the plate 110o, whereby heat generated mainly by the electronic component 40 is transmitted to the plate 110o.

The radiator 80 is connected to each plate 110. The radiator 80 emits the heat transmitted from each of the plates 110 to external space.

Note that one plate 110 and two circuit boards 10 sandwiching the plate 110 are referred to as one unit.

Figure 6:
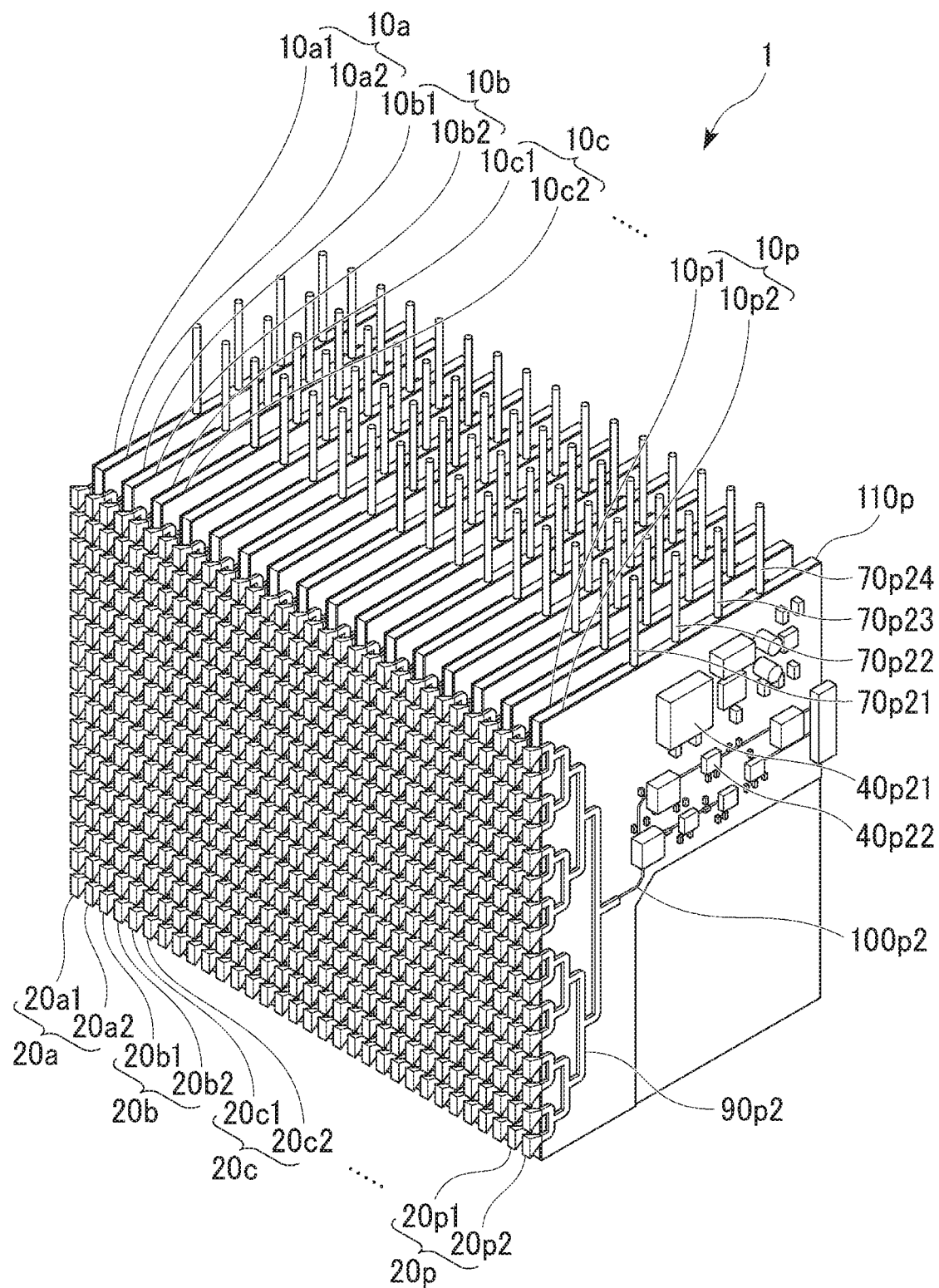
FIG. 6 is a perspective view showing a state in which the radiator is removed from the antenna apparatus shown in FIG. 1.
Figure 7:
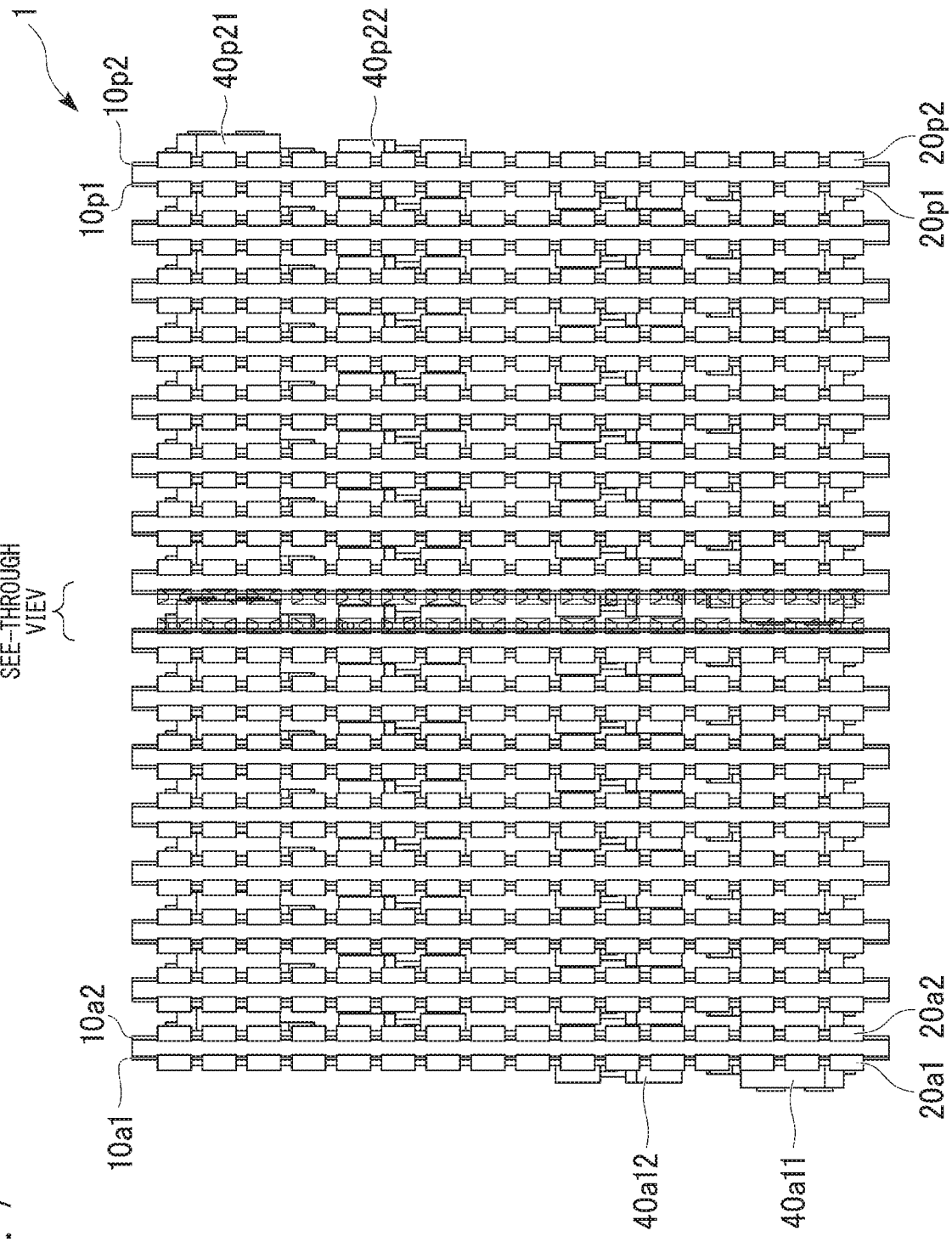
FIG. 7 is a front view of the antenna apparatus shown in FIG. 1, including a partial see-through view.

Next, the entire antenna apparatus 1 is shown in FIGS. 6 and 7.

Here, in the drawings of the entire antenna apparatus 1 shown in FIGS. 6 and 7, in order to make the structure of the heat pipe 70 easier to understand, the radiator 80 is omitted from the drawing of the entire antenna apparatus 1 shown in FIG. 1. FIG. 6 is a perspective view of the antenna apparatus 1. FIG. 7 is a front view (including a partial see-through view in the middle) of the antenna apparatus 1 as viewed from the side of the antenna element 20.

The antenna apparatus 1 is constituted with 16 units, with one unit being shown in FIG. 5.

As shown in FIG. 6, the heat pipe 70 is configured to pass through the interior of the plate 110 from four positions of the plate 110 in each unit.

The electronic component 40 mounted on each circuit board 10 is arranged at a position such that the sum of the heights of the electronic components 40 between the units is equal to or less than the gap between the circuit boards 10 as shown in the see-through view portion in FIG. 7.

Next, the antenna apparatus 1 with a minimum configuration according to the embodiment of the present invention will be described.

The minimum configuration antenna apparatus 1 according to an embodiment of the present invention includes at least a plurality of circuit boards 10, an antenna element 20, and an electronic component 40 in the antenna apparatus 1 shown in FIG. 5.

A plurality of the antenna elements 20 are arranged along a side of the plurality of circuit boards 10 located on the front face of the antenna apparatus 1.

The electronic component 40 is arranged along the surface of the circuit board 10, with the dimension in the thickness direction of the circuit board 10 configured to be larger than the gap between the antenna elements 20, and connected to the plurality of arranged antenna elements 20 via the high-frequency transmission circuit.

The plurality of circuit boards 10 are arranged with the component mounting surfaces arranged oppositely to each other and the positions corresponding to the electronic component 40 misaligned in pairs in the direction of the component mounting surface of the circuit boards 10.

In this way, it is possible to reduce the size of the antenna apparatus 1, which is required to be capable of outputting high-frequency radio waves and in which electronic components with large dimensions are used.

In the antenna apparatus 1 according to the embodiment of the present invention, the antenna elements 20 were described as being arranged along the side of each corresponding circuit board 10 located at the front of the apparatus, but the arrangement position is not limited thereto. For example, the antenna elements 20 may be arranged along a surface of a circuit board dedicated to the antenna other than the corresponding circuit board 10, and the antenna apparatus 1 may be configured such that power is supplied from the circuit board 10 to the circuit board dedicated to the antenna.

In the processing according to the embodiment of the present invention, the order of processing may be switched within a range in which appropriate processing is performed.

Although one embodiment of the present invention has been described, a control unit or FPGA 50 in the antenna apparatus 1 described above may have a computer system therein. The processing described above is stored in a computer-readable recording medium in the form of a program, and the above processing is performed by the computer reading and executing this program.

Here, the computer-readable recording medium means a magnetic disk, a magneto-optical disk, a CD-ROM, a DVD-ROM, a semiconductor memory, or the like. Alternatively, the computer program may be distributed to a computer through communication lines, and the computer that has received this distribution may execute the program.

The above program may realize some of the above-described functions. Furthermore, the program may be a so-called differential file (differential program), whereby the functions described above can be realized by combination with programs that are already recorded in the computer system.

While a number of preferred embodiments of the present invention have been described and illustrated above, it should be understood that these are exemplary of the invention and are not to be considered as limiting. Additions, omissions, substitutions, and other modifications can be made without departing from the spirit or scope of the present invention.

Some or all of the above exemplary embodiments can also be described as, but not limited to, the following supplementary notes.

(Supplementary Note 1)

An antenna apparatus provided with:

a plurality of circuit boards arranged in parallel with component mounting surfaces opposed to each other;

a plurality of antenna elements that are arranged along mutually adjacent sides of the plurality of circuit boards, being arranged side by side in an orthogonal direction that is orthogonal to the component installation surfaces of the plurality of circuit boards; and an electronic component arranged on the component mounting surfaces of the circuit boards and connected to the antenna elements via a high-frequency transmission circuit, wherein the plurality of circuit boards are arranged so that a gap therebetween in the orthogonal direction is greater than a gap between the plurality of antenna elements arranged side by side in the orthogonal direction, and the electronic components arranged on different circuit boards at the opposing component mounting surfaces are arranged misaligned in the mounting surface direction of the circuit boards.

(Supplementary Note 2)

The antenna apparatus according to Supplementary Note 1, wherein the plurality of circuit boards are oppositely arranged over the entirety of the component mounting surfaces.

(Supplementary Note 3)

The antenna apparatus according to Supplementary Note 1, wherein the plurality of circuit boards are arranged in parallel in the orthogonal direction.

(Supplementary Note 4)

The antenna apparatus according to any one of Supplementary Note 1 to Supplementary Note 3, further comprising:

a conductive cap that covers the electronic component;

a flow path that is provided along the component mounting surface of the circuit board and that circulates heat; and a radiator that is connected to the flow path and that emits the heat circulated through the flow path to the atmosphere.

(Supplementary Note 5)

The antenna apparatus according to Supplementary Note 4, wherein the flow path is provided on a surface of the circuit board opposite the component mounting surface.

(Supplementary Note 6)

The antenna apparatus according to any one of Supplementary Note 1 to Supplementary Note 5, wherein the arranged antenna elements are arranged on one side of the plurality of circuit boards and at a predetermined interval in the orthogonal direction.

(Supplementary Note 7)

An antenna apparatus comprising a plurality of circuit boards arranged in parallel in an orthogonal direction that is orthogonal to a component mounting surface; a plurality of antenna elements provided in a first space between the plurality of circuit boards; an electronic component that is provided in the first space and connected via a high-frequency transmission circuit to the antenna elements; and a heat flow path provided in a second space adjacent to the first space.

(Supplementary Note 8)

The antenna apparatus according to Supplementary Note 7, wherein a gap in the orthogonal direction of the second space is smaller than a gap in the orthogonal direction of the first space.

(Supplementary Note 9)

The antenna apparatus according to any one of Supplementary Note 1 to Supplementary Note 8, wherein when the electronic component is mounted in the first space between the circuit boards and only on the component mounting surface of one circuit board among the circuit boards, the height of the electronic component is equal to or less than the gap in the orthogonal direction of the first space.

(Supplementary Note 10)

The antenna apparatus according to any one of Supplementary Note 1 to Supplementary Note 9, wherein when the electronic component is mounted in the first space between the circuit boards and on the component mounting surfaces of both circuit boards of the circuit boards, a total of the heights of the electronic components mounted at opposing positions is equal to or less than the gap in the orthogonal direction of the first space.

(Supplementary Note 11)

The antenna apparatus according to any one of Supplementary Note 1 to Supplementary Note 10, wherein in the first space between the circuit boards, a notch in which a part of the electronic component is accommodated is provided in the other circuit board among the circuit boards at a position overlapping with the electronic component arranged on the component mounting surface of the one circuit board.

(Supplementary Note 12)

A circuit board to which is mounted an electronic component that is connected by a high-frequency transmission circuit to antenna elements arranged in a plurality, with a spatial dimension in which the electronic component is mounted in the thickness direction of the circuit board configured to be larger than a gap between the antenna elements arranged in a plurality, the circuit board being arranged with mounting surfaces arranged oppositely to each other and, for each pair, positions corresponding to the electronic component misaligned in the surface direction of the circuit board.

(Supplementary Note 13)

An arrangement method for arranging circuit boards on each of which is mounted an electronic component that supplies power to antenna elements arranged in a plurality, with a spatial dimension in which the electronic components are mounted in the thickness direction of the circuit boards configured to be larger than a gap between the antenna elements arranged in a plurality, mounting surfaces arranged oppositely to each other and, for each pair, positions corresponding to the electronic components misaligned in the surface direction of the circuit boards.

DESCRIPTION OF THE REFERENCE SYMBOLS

1: Antenna apparatus
10, 10$a$1, 10$a$2, 10$b$1, 10$b$2, 10$p$2: Circuit board
20, 20$a$1, 20$a$2, 20$b$1, 20$b$2, 20$p$2: Antenna element
40, 40$a$1, 40$a$2, 40, 40$b$1, 40$b$2, 40$p$2: Electronic component
60, 60$a$1, 60$a$2, 60$b$1, 60$p$: Conductive cap
70, 70$a$11, 70$a$12, 70$a$13, 70$a$14, 70$p$21, 70$p$22, 70$p$23, 70$p$24: Heat pipe
80: Radiator
90, 90$a$1, 90$p$2: High-frequency transmission circuit
100, 100$a$1, 100$p$2: High-frequency transmission line
110, 110$a$, 110$o$, 110$p$: Plate

The invention claimed is:

1. An antenna apparatus comprising:
a plurality of circuit boards arranged in parallel with component mounting surfaces opposed to each other;
a plurality of antenna elements that are arranged along mutually adjacent sides of the plurality of circuit boards, being arranged side by side in an orthogonal direction that is orthogonal to the component mounting surfaces of the plurality of circuit boards; and
an electronic component arranged on each of the component mounting surfaces of the plurality of circuit boards and connected to the antenna elements via a high-frequency transmission circuit;
a conductive cap that covers the electronic component;
a flow path that is provided along the component mounting surfaces of the plurality of circuit board and that circulates heat; and
a radiator that is connected to the flow path and that emits the heat circulated through the flow path to the atmosphere,
wherein the plurality of circuit boards are arranged so that a gap therebetween in the orthogonal direction is greater than a gap between the plurality of antenna elements arranged side by side in the orthogonal direction, and electronic components arranged on different circuit boards at the opposing component mounting surfaces are arranged misaligned in the mounting surface direction of the circuit boards.

2. The antenna apparatus according to claim 1, wherein the plurality of circuit boards are oppositely arranged over the entirety of the component mounting surfaces.

3. The antenna apparatus according to claim 1, wherein the plurality of circuit boards are arranged in parallel in the orthogonal direction.

4. The antenna apparatus according to claim 1, wherein the flow path is provided on a surface of the circuit board opposite the component mounting surface.

5. The antenna apparatus according to claim 1, wherein the arranged antenna elements are arranged on one side of the plurality of circuit boards and at a predetermined interval in the orthogonal direction.

6. The antenna apparatus according to claim 1, wherein:
the plurality of antenna elements are provided in a first space between the plurality of circuit boards;

the electronic component is provided in the first space; and the heat flow path is provided in a second space adjacent to the first space.

7. The antenna apparatus according to claim 6, wherein a gap in the orthogonal direction of the second space is smaller than a gap in the orthogonal direction of the first space.

8. The antenna apparatus according to claim 6, wherein when the electronic component is mounted in the first space between the circuit boards and only on the component mounting surface of one circuit board among the circuit boards, the height of the electronic component is equal to or less than the gap in the orthogonal direction of the first space.

9. The antenna apparatus according to claim 6, wherein when the electronic component is mounted in the first space between the circuit boards and on each of the component mounting surfaces of the circuit boards, a sum of the heights of the electronic components mounted on one of the component mounting surfaces and the electronic component mounted on the opposing component mounting surface is equal to or less than the gap in the orthogonal direction of the first space.

10. The antenna apparatus according to claim 6, wherein in the first space between the circuit boards, a notch in which a part of the electronic component is accommodated is provided in one of the circuit boards among the circuit boards at a position overlapping the electronic component arranged on the component mounting surface of the one circuit board.

11. A plurality of circuit boards each comprising: a plurality of antenna elements arranged on a side of the respective circuit board; an electronic component that is connected by a high-frequency transmission circuit to the plurality of antenna elements mounted on a component mounting surface of the respective circuit board; and a conductive cap mounted on a component mounting surface of the respective circuit board so as to cover the electronic component, the plurality of the circuit boards being arranged in parallel with component mounting surfaces opposed to each other with a spatial dimension in which the electronic component and the conductive cap are mounted in an orthogonal direction that is orthogonal to the component mounting surfaces of the plurality of circuit boards, the spatial dimension being configured to be larger than a gap between the antenna elements in the orthogonal direction, wherein the electronic components and the conductive caps mounted on different circuit boards are arranged misaligned in the component mounting surface direction of the respective circuit board.

12. An arrangement method for arranging circuit boards comprising:

arranging a plurality of antenna elements on a side of each of the circuit boards;

mounting an electronic component that supplies power to the antenna elements on a component mounting surface of each of the circuit boards;

mounting a conductive cap on the component mounting surface of each of the circuit boards so as to cover the electronic component;

arranging the circuit boards with the component mounting surfaces opposite to each other with a spatial dimension in which the electronic components and the conductive caps are mounted in an orthogonal direction that is orthogonal to the component mounting surfaces of the plurality of the circuit boards, the spatial dimension being configured to be larger than a gap between the antenna elements in the orthogonal direction; and arranging the electronic components and the conductive caps mounted on different circuit boards being misaligned in the component mounting surface direction of the circuit boards.

* * * * *